United States Patent
Muralimanohar et al.

(10) Patent No.: US 9,911,491 B2
(45) Date of Patent: Mar. 6, 2018

(54) DETERMINING A RESISTANCE STATE OF A CELL IN A CROSSBAR MEMORY ARRAY

(71) Applicant: Hewlett Packard Enterprise Development LP, Houston, TX (US)

(72) Inventors: Naveen Muralimanohar, Santa Clara, CA (US); Erik Ordentlich, San Jose, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/324,792

(22) PCT Filed: Jul. 31, 2014

(86) PCT No.: PCT/US2014/049271
§ 371 (c)(1),
(2) Date: Jan. 9, 2017

(87) PCT Pub. No.: WO2016/018404
PCT Pub. Date: Feb. 4, 2016

(65) Prior Publication Data
US 2017/0213590 A1    Jul. 27, 2017

(51) Int. Cl.
*G11C 11/00* (2006.01)
*G11C 13/00* (2006.01)

(52) U.S. Cl.
CPC .... *G11C 13/004* (2013.01); *G11C 2013/0042* (2013.01); *G11C 2013/0045* (2013.01)

(58) Field of Classification Search
CPC .......... G11C 13/004; G11C 2013/0042; G11C 2013/0045

USPC ....... 365/46, 55, 74, 97, 100, 131, 148, 158, 365/171, 173, 163
See application file for complete search history.

(56) References Cited

U.S. PATENT DOCUMENTS

| | | |
|---|---|---|
| 7,609,577 B2 | 10/2009 | Anand et al. |
| 7,889,588 B2 | 2/2011 | Watson et al. |
| 8,081,501 B2 | 12/2011 | Choi et al. |
| 8,416,604 B2 | 4/2013 | Kim et al. |
| 8,526,266 B2 | 9/2013 | Kim et al. |
| 9,064,565 B2 * | 6/2015 | Pellizzer ................. G11C 11/56 |
| 2002/0167838 A1 | 11/2002 | Perner |
| 2003/0206473 A1 | 11/2003 | Tran |
| 2004/0170048 A1 | 9/2004 | Hsu |
| 2009/0175094 A1 | 7/2009 | Scheuerlein |
| 2011/0286259 A1 | 11/2011 | Perner |

OTHER PUBLICATIONS

International Searching Authority, The International Search Report and the Written Opinion, dated Mar. 13, 2015, 13 Pages.
Zidan, M.A. et al., Memristor-based Memory: The Sneak Paths Problem and Solutions, Microelectronics Journal, Oct. 29, 2012, pp. 1-9.

* cited by examiner

*Primary Examiner* — Fernando Hidalgo
(74) *Attorney, Agent, or Firm* — Michael A. Dryja

(57) ABSTRACT

According to an example, in a method for determining a resistance state of a cell in a crossbar memory array, a first read voltage may be applied across a cell to sense a first cell current. In addition, a second read voltage may be applied across the cell to sense a second cell current. A difference value between the first cell current and the second cell current may be identified and a resistance state of the cell may be determined based on the difference value.

11 Claims, 6 Drawing Sheets

DETERMINING A RESISTANCE STATE OF A CELL IN A CROSSBAR MEMORY ARRAY

BACKGROUND

Electronic data is typically represented using a binary number system. The binary number system is one in which values may take on one of two states, typically represented by a logical "1" and a "0". Various types of memory systems have been developed which include small programmable devices that store a single bit as either a logical "1" or a "0". The ON state may be used to represent a logical "1," while the OFF state may be used to represent a logical "0". One type of memory architecture is the crossbar memory architecture. The crossbar memory architecture includes two sets of interconnecting wire segments and memory elements are placed at multiple crosspoints between the interconnecting wire segments.

BRIEF DESCRIPTION OF THE DRAWINGS

Features of the present disclosure are illustrated by way of example and not limited in the following figure(s), in which like numerals indicate like elements, in which.

DETAILED DESCRIPTION

Figure 1:
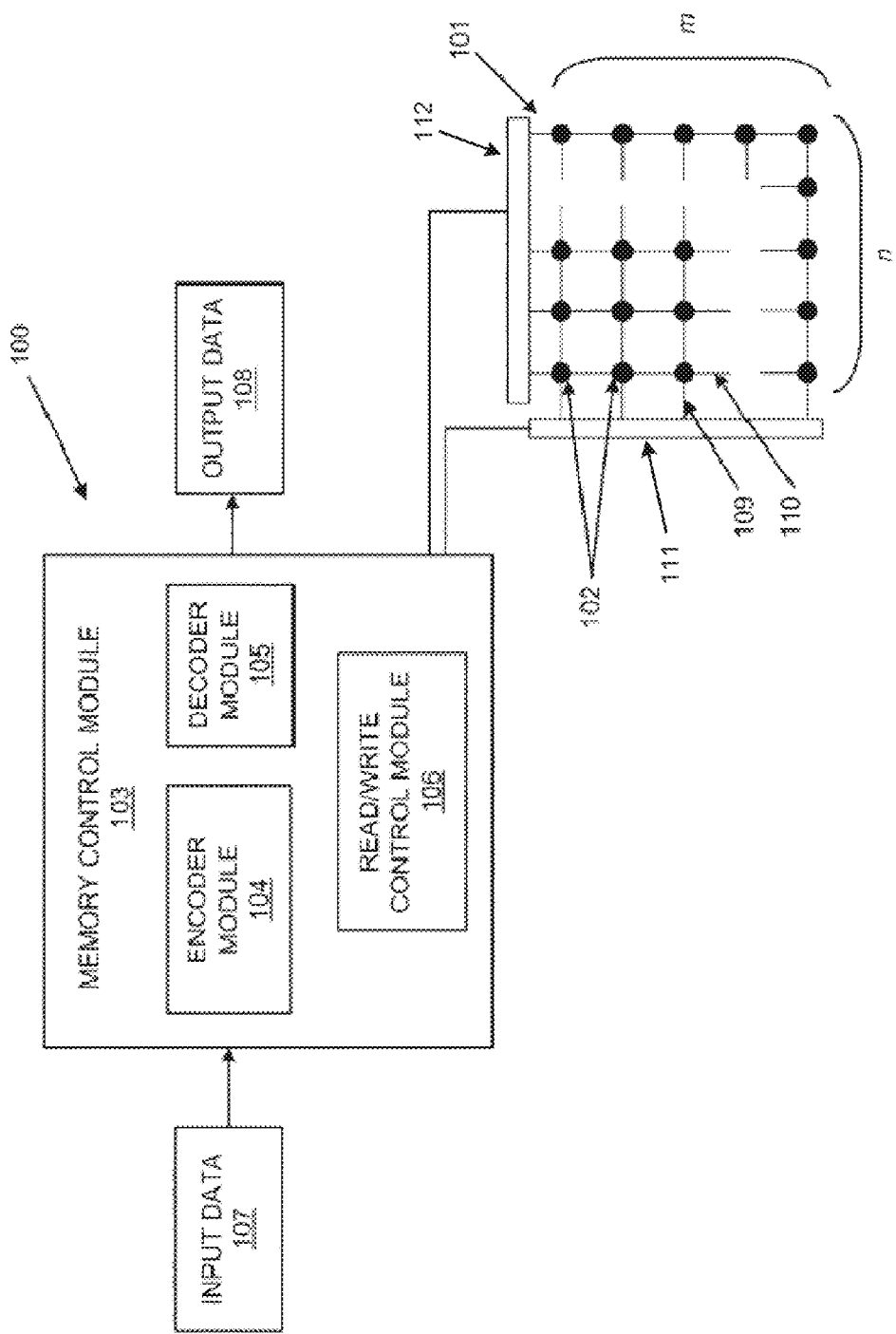
FIG. 1 shows a schematic view of a data storage apparatus including a crossbar array of memory elements, according to an example of the present disclosure.

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

Disclosed herein are examples of methods for determining a resistance state of a cell in a crossbar memory array. Particularly, the disclosed examples provide dual-sensing reading methods to improve read margin reliability while determining the resistance state of a cell. In this regard, for instance, the disclosed methods may provide tolerance for variation in selector threshold and parasitic current (e.g., leak current or sneak current). Also disclosed herein are a data storage system and a dual-sensing circuit for implementing the methods.

According to a disclosed example, a first read voltage is applied across a cell in a crossbar memory array to sense a first current through the cell. In addition, a second read voltage is applied across the cell to sense a second current through the cell. The first read voltage, for instance, may be lower than the second read voltage and the second read voltage may be lower than a write voltage for the cell. A difference value between the first current and the second current may be identified and amplified. In addition, a resistance state of the cell may be determined based on the amplified difference value. For example, a low resistance state (i.e., logical "1" or ON) may be determined for the cell in response to a high amplified difference value and a high resistance state (i.e., logical "0" or OFF) may be determined for the cell in response to a low amplified difference value.

According to another disclosed example, the cell may further include a selector in series with the cell. The selector, for instance, may include a threshold voltage (Vth) in order to provide non-linearity to the cell and reduce the loss of current across a row of the crossbar memory array due to leakage or sneak current. As used herein, the term "non-linearity" refers generally to a characteristic of a function with the characteristic comprising deviation over a finite domain from the slope of a straight line that most closely approximates the function over that domain. With particular reference to current-voltage (I-V) functions, "nonlinear" functions exhibit marked departures from a linear ohmic function. An exponential I-V function is a particular example of such a function. More specifically, a highly nonlinear I-V function can exhibit substantially adjacent domains of very high resistance and very low resistance. The cell in the crossbar memory array may be a memristor device in series with a nonlinear selector, according to an example.

In a memristor cell, variation in selector threshold and leakage or sneak current may significantly impact the read margin. For instance, when using Niobium Oxide as a selector, which is prone to be thermally sensitive, the variation in selector behavior may lead to high read failures. In addition, a high variation in sneak or leakage current may also lead to high read failures. Accordingly, the disclosed examples provide a low overhead, dual-sensing reading method that may trade-off access time to dramatically improve the read margin to tolerate variations in selector threshold and leakage or sneak current. Generally speaking, the disclosed examples provide a dual-sensing reading method that may improve the read margin for cells in the crossbar memory array and enhance the distribution of ON and OFF current for the cells in the crossbar memory array.

FIG. 1 illustrates a schematic view of a data storage apparatus 100 that includes a memory control module 103, according to an example. The memory control module 103 may control operations of storing and retrieving data to and from an m×n memory array 101 of cells 102, which may be memristor devices, memristors, etc. The apparatus 100 is depicted as including an encoder module 104 that is to encode data and a decoder module 105 that is to decode data. The apparatus 100 is further depicted as including a read/write control module 106 that is to control operations of reading data from the memory array 101 and writing data to the memory array 101. The memory control module 103 may encode input data 107 and store the encoded data into the memory array 101. The memory control module 103 may also read out the encoded data stored in the memory array 101, decode the data to recover the original bits in the input data 107, and transmit the decoded data as output data 108.

According to an example, the memory array 101 is part of the apparatus 100. In another example, the memory array 101 is separate from the apparatus 100. In any regard, the m×n memory array 101 may respectively include first and second sets of m and n conductors, e.g., wires. Each of the m conductors in the first set may cross each of the n conductors in the second set to address one of the cells 102 located at the crossing point. In order to facilitate a description of the memory array 101, the conductors in the first and second sets may be respectively referred to as rows (i.e., wordlines) and columns (i.e., bitlines) of the memory array 101. The m×n memory array 101 may include m row conductors 109 and n column conductors 110 in a circuit plane. The crosspoints of the row conductors 109 and the column conductors 110 may form a total of m×n cells. The reading and writing of individual bits of data to the cells 102 involves the application of voltages by row drivers 111 and column drivers 112. The conductors 109, 110 and cells 102 may be formed in different circuit planes. Moreover, the conductors 109, 110 may be formed of a variety of shapes as needed or desired, and may likewise form a grid of a variety of shapes.

Figure 2:
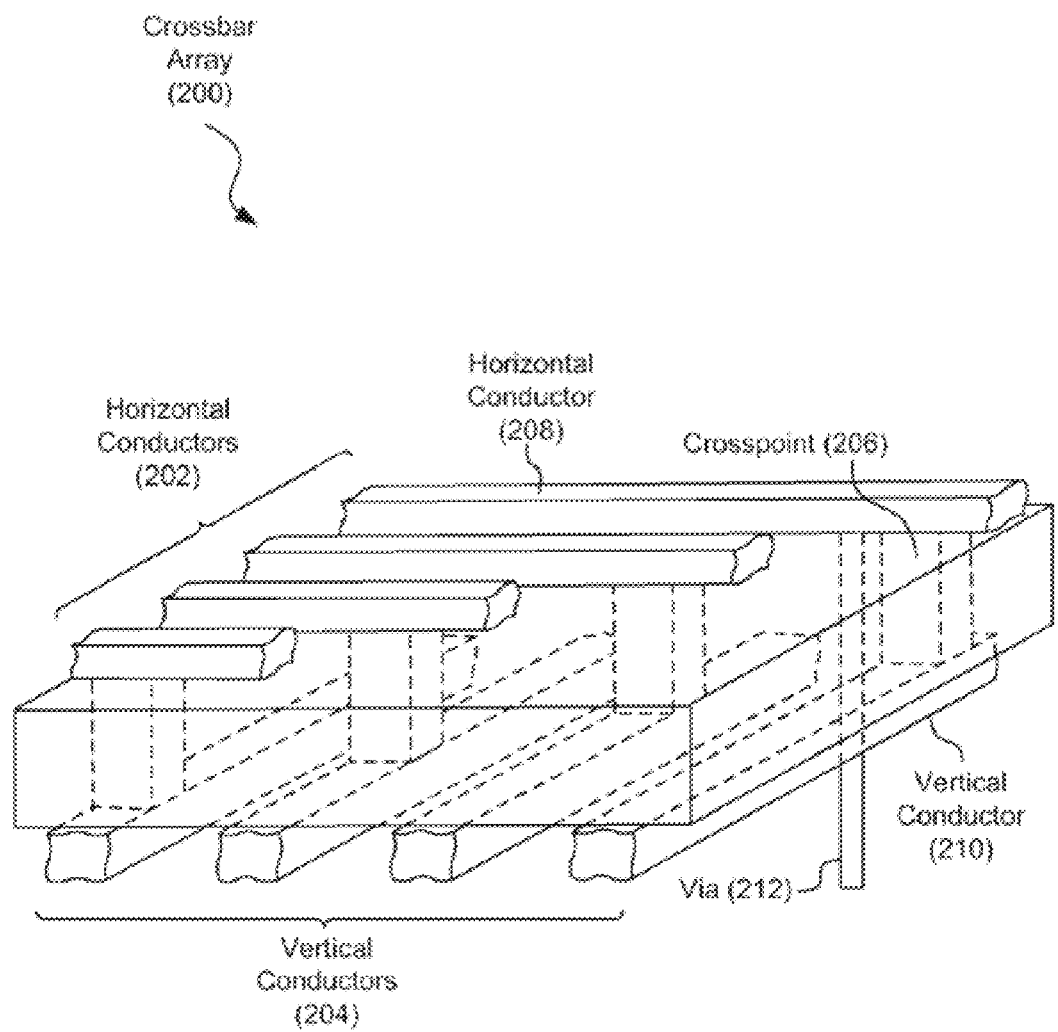
FIG. 2 shows a diagram of a crossbar memory array, according to an example of the present disclosure.

FIG. 2 is a diagram showing a crossbar memory array 200 according to an example of the present disclosure. According to an example, the crossbar memory array 200 includes a set of horizontal conductors 202, which are depicted as being generally in parallel with respect to each other. Additionally, a set of vertical conductors 204 is depicted as being generally perpendicular to, and crossing, the horizontal conductors 202. Programmable cells 102 are further depicted as being placed at the crosspoints 206 between a horizontal conductor 208 and a vertical conductor 210.

As discussed above, the cells 102 may be memristors or equivalently, memristor devices. Memristors exhibit a "memory" of past electrical conditions. For example, a memristor may include a matrix material that contains mobile dopants that may be moved within the matrix material to dynamically alter the electrical operation of the memristor.

The motion of dopants may be induced by the application of a programming condition such as an applied electrical voltage across the memristive matrix material. Particularly, the programming voltage generates a relatively high electrical field through the memristive matrix material and alters the distribution of dopants. After removal of the electrical field, the location and characteristics of the dopants remain stable until the application of another programming electrical field. For example, by changing the dopant configurations within the memristive matrix material, the electrical resistance of the memristor may be altered. The state of the memristor may be read by applying a lower reading voltage across the memristive matrix material which allows the internal electrical resistance of the memristor to be sensed but does not generate a sufficiently high electrical field to cause significant dopant motion. Consequently, the state of the memristor may remain stable over long time periods and through multiple read cycles.

According to an example, the crossbar memory array 200 may be used to form a non-volatile memory array. In this example, each of the cells at the crosspoints 206 may be used to represent a bit of data. Although individual conductors 208, 210 in FIG. 2 are shown with rectangular cross sections, the crossbar memory array 200 may also have square, circular, elliptical, or more complex cross sections. The conductors may also have many different widths, diameters, aspect ratios and/or eccentricities. The crossbars may be nanowires, sub-microscale wires, microscale wires, or wires with larger dimensions.

According to various examples, the crossbar memory array 200 may be integrated into a Complimentary Metal-Oxide-Semiconductor (CMOS) circuit or other conventional computer circuitry. Each individual conductor may be connected to the CMOS circuitry by a via 212. The via 212 may be an electrically conductive path through the various substrate materials used in manufacturing the crossbar architecture. This CMOS circuitry may provide additional functionality to the memristor such as input/output functions, buffering, logic, configuration, or other functionality. Multiple crossbar memory arrays may be formed over the CMOS circuitry to create a multilayer circuit.

Figure 3A:
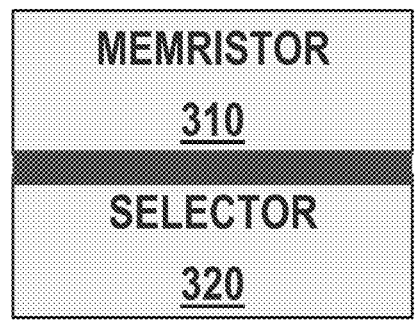
FIG. 3A shows a cell including a switching element and a selector, according to an example of the present disclosure.

As discussed above, a cell 300 may include a switching element, such as a memristor 310, with at least two stable states to store a logical "1" or a logical "0" and a selector 320 in series with the memristor 310 to provide non-linearity to the cell, as shown in FIG. 3A. Ideally, in a crossbar memory array 101, the selector sub-threshold leakage or sneak current (i.e., current through the selector 320 for any voltage drop across a cell less than Vth, where Vth is the threshold voltage of a selector) is close to zero. Further, ideally Vth should be the same for all the selectors in the crossbar memory array.

Figure 3B:
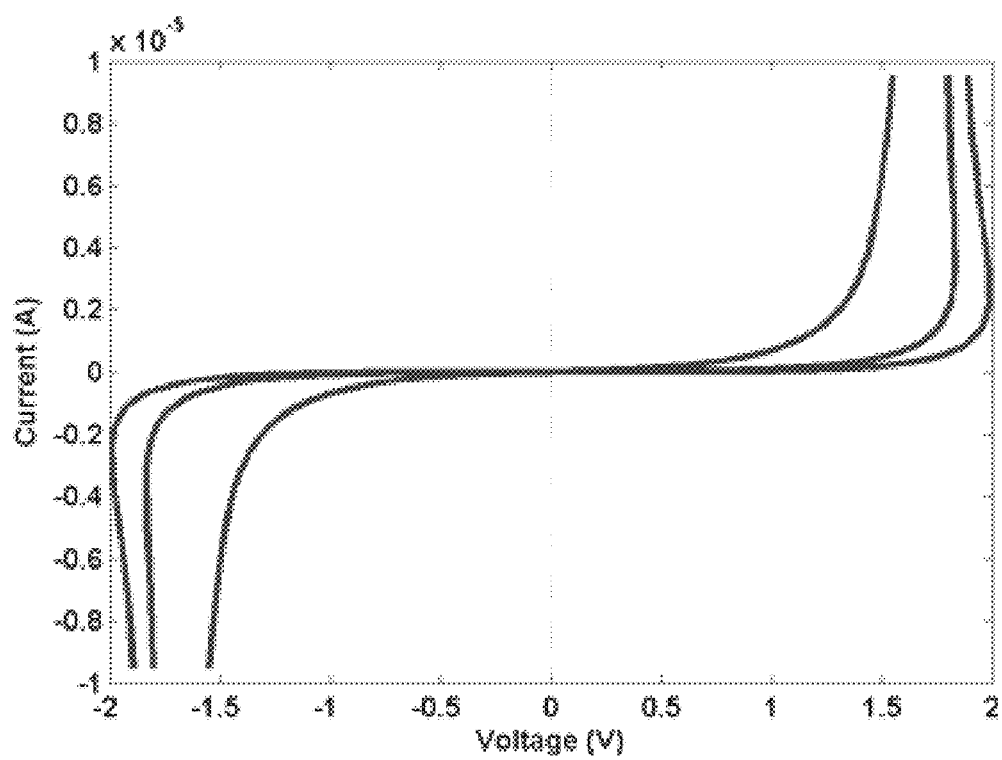
FIG. 3B shows current-voltage (I-V) curves for selectors according to an example of the present disclosure.

However, as shown in example I-V curves 350 for selectors in FIG. 3B, due to process variation in selectors and Niobium Oxide's sensitivity to temperature, the leakage or sneak current of the cell may vary from 200 nanoamperes (nA) to 2 microamperes (uA), and Vth (i.e., the knee of a selector curve) may vary from 1.3 V to 2V. Therefore, as the standard deviation of a cell's selector threshold voltage in a crossbar increases, the effective read margin available at the sense-amplifier goes down, which eventually leads to a read failure.

Figure 4:
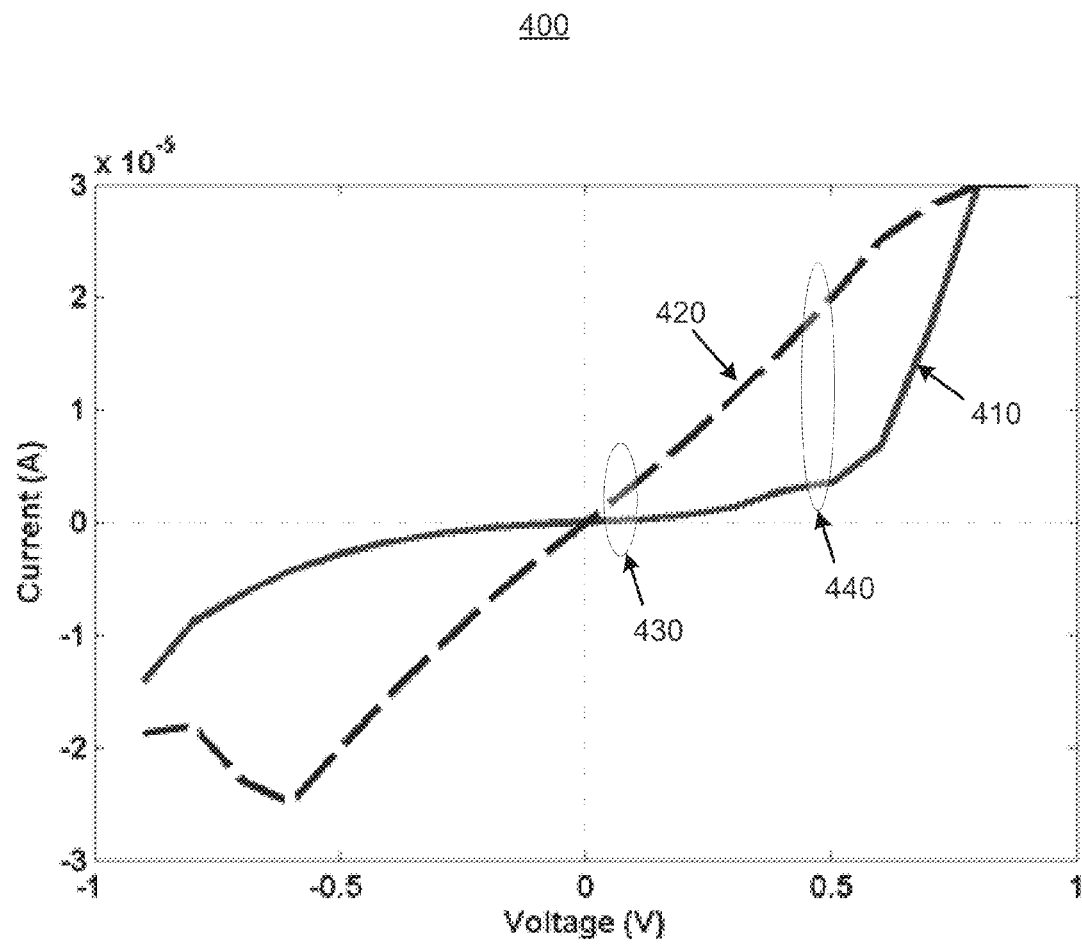
FIG. 4 shows I-V curves for a memristor, according to an example of the present disclosure.

With reference to FIG. 4, there are shown examples of memristor ON and OFF I-V curves 400. In FIG. 4 the solid line represents a high resistance state (i.e., OFF or logical "0") 410 and dotted line represents a low resistance state (i.e., ON or logical "1") 420. To perform a read, the read/write control module 106, for instance, may apply a voltage across the selected row and column conductors to induce approximately 500 millivolts (mV) across the memristor component of a cell and sense the resulting current. To write to a cell, the read/write control module 106, for instance, may apply a voltage across the selected row and column conductors to induce a voltage of approximately 900 mV across the memristor component of a cell to alter the state of the cell.

If the selector Vth varies, such as increasing by approximately 400 mV, then the effective read voltage across the memristor goes down causing the read margin between the high resistance state and the low resistance state to decrease. In this instance, for example, the read/write control module 106 may sense the cell current at approximately 100 mV (as indicated by ellipse 430) across the memristor where the read margin between the high resistance state and the low resistance state is low instead of at approximately 500 mV (as indicated by ellipse 440) where the read margin between the high resistance state and the low resistance state is very high. This may result in a read failure. Moreover, the overall read voltage may not simply be increased to solve this problem because, if the selector Vth is low for some cells, then having a high read voltage may write to a cell instead, which may cause a read disturbance. As discussed in greater detail herein, the disclosed methods provide a two-level reading method that may trade access time for improved reliability.

Figure 5:
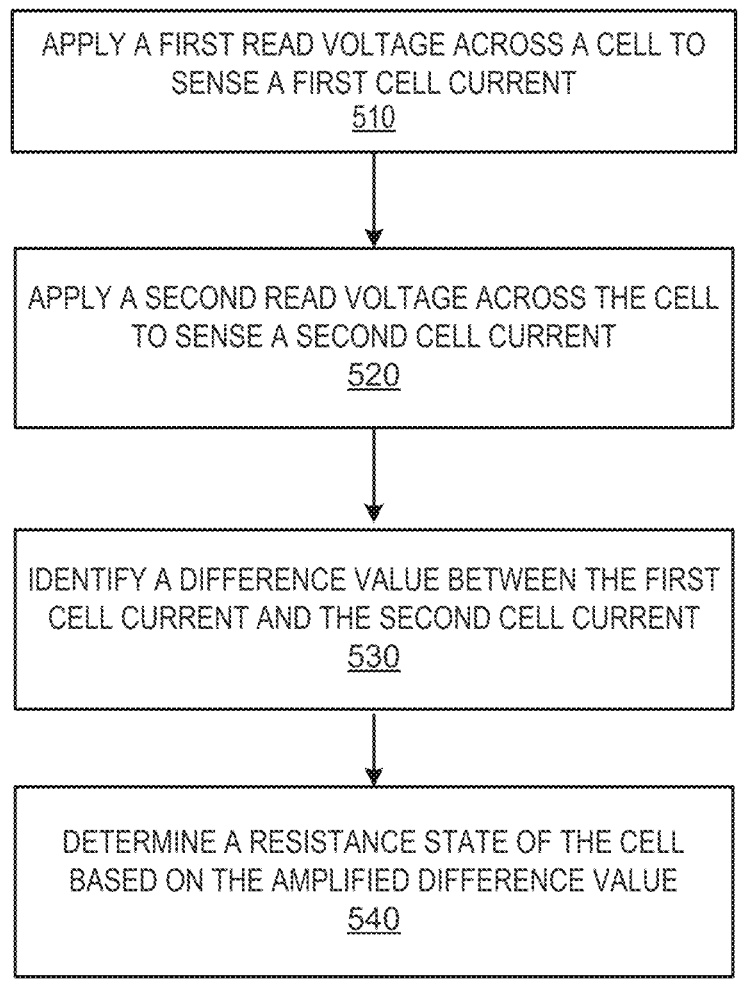
FIG. 5 shows a flow chart of a method for determining a resistance state of a cell in a crossbar memory array, according to an example of the present disclosure.
Figure 6:
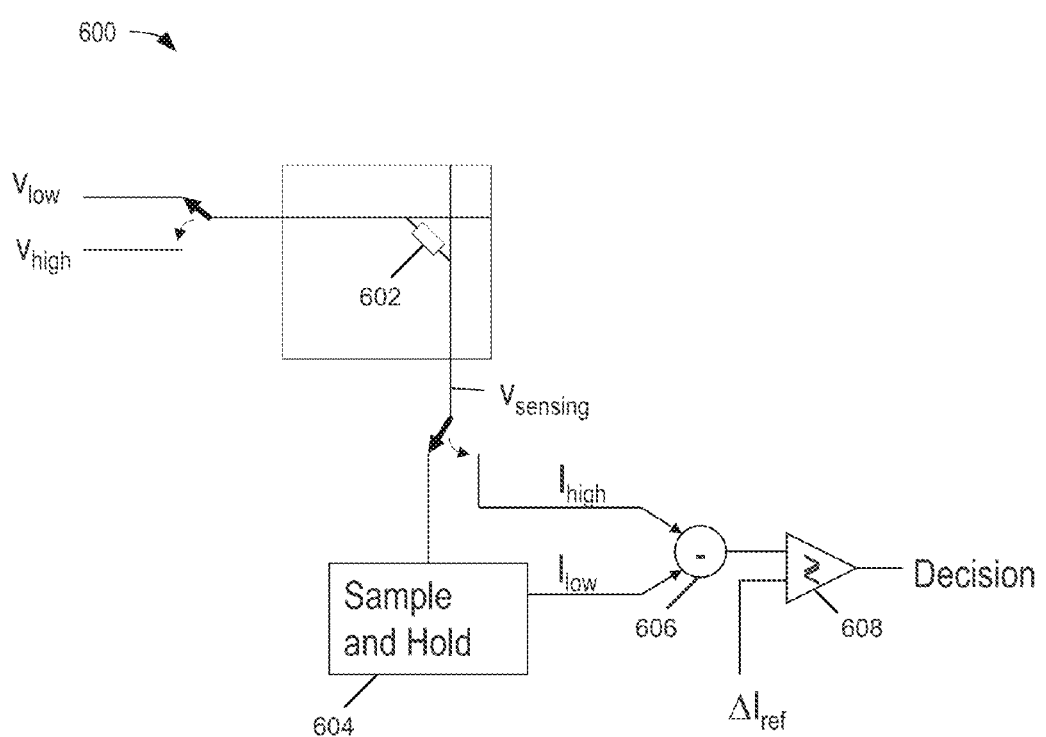
FIG. 6 shows a dual-sensing circuit, according to an example of the present disclosure.

With reference to FIG. 5, there is shown a flow chart of a method 500 for determining a resistance state of a cell in a crossbar memory array, according to an example of the present disclosure. It should be apparent to those of ordinary skill in the art that methods 500 represents a generalized illustration and that other operations may be added or existing operations may be removed, modified or rearranged without departing from the scopes of methods 500. The method 500 may be implemented, for example, by a dual-sensing circuit 600 as depicted in FIG. 6 below.

As discussed above, the cell may be a memristor cell that further includes a selector in series with the memristor cell. The selector may include a threshold voltage (Vth) and may be added to provide non-linearity to the cell, which may help reduce leakage or sneak current. For example, for up to a Vth of 1.5 V, the selector may be completely off. If, however, the Vth is exceeded, significant voltage may drop across the memristor cell.

As mentioned above with respect to FIG. 4, in an ideal scenario shown by the ellipse 440 (~500 mV), the difference between the low resistance state 420 and the high resistance state 410 current is very high. However, if the read voltage difference across the memristor cell is lower, such as around approximately 100 mV, then the low resistance state current 420 is as low as the high resistance state current 410, which may cause a read failure. Moreover, the low resistance state current may fall below a low resistance state decision threshold level, which is set independently of Vth. As discussed above, the reason for the decreased read voltage may stem from a variation in the Vth of the selector due to process variation and/or sensitivity to temperature and variation in the leakage or sneak current across a row or column of the crossbar memory array.

In this regard, a rate of increase or slope of the current through a memristor cell is a more reliable metric than the actual current through the memristor cell. That is, the rate at which the current increases may be a more accurate representation of the resistance state of the memristor cell than simply measuring the current at one static point. For example, the rate of increase in the low resistance state 420 current is always greater than the rate of increase for the high resistance state 410 current irrespective of any voltage variation due to the selector or the parasitic current across the row of the crossbar memory array.

Accordingly, the method 500 provides a dual-sensing reading scheme, which may trade-off access time for improved reliability. In FIG. 5, the read/write control module 106, for instance, may apply a first read voltage across a memristor cell to sense or measure a first cell current, as shown in block 510. According to an example, the read/write control module 106 may apply a first read voltage that is higher than 200 mV. For instance, 200 mV may be a selected voltage to apply across the memristor cell. To apply 200 mV, however, a larger voltage needs to be applied because some voltage will drop across the selector (Vth) and other circuit elements. In other words, to get 200 mV across the memristor cell, Vth+200 mV+Vparasitic (i.e., parasitic voltage) would need to be applied across the row column conductors. However, Vth and Vparasitic are varying and unknown. Therefore, according to an example, a reasonably large Vread (i.e., read voltage) is selected so that there is a high likelihood that Vread>Vth+200 mV+Vparasitic. On the other hand, Vread should be less than Vth+Vswitch (i.e., switching voltage)+Vparasitic. Otherwise, the memristor cell may switch. According to an example, the first read voltage may be less than a second read voltage as discussed below.

In block 520, the read/write control module 106, for instance, may apply a second read voltage across the cell to sense a second cell current. According to an example, the read/write control module 106 may apply the second read voltage that is higher than 500 mV. As discussed above, to apply a selected voltage of 500 mV so that there is a high likelihood that Vread>Vth+500 mV+Vparasitic. On the other hand, Vread should be less than Vth+Vswitch+Vparasitic, since otherwise the memristor cell may switch. The second read voltage may include a voltage that is more than the first read voltage and below a write voltage.

The first and second read voltages may be targeted towards a high side of a valid read voltage range. This makes it likely that voltage drops induced across the memristor cell for both the first and second read voltages are above Vth, but not so high that the memristor cell is disturbed when its selector has too low of a Vth. According to an example, the method 500 may be optimized when the first and second read voltages are relatively close together, such that memristor cell voltage drops for both the first and second read voltages are above Vth even when Vth is on the high side. For instance, the first read voltage and the second read voltage may be within a close predetermined range, wherein the induced voltage drop range on the memristor cell for the predetermined range is at least above Vth with sufficiently high likelihood, as Vth varies from cell to cell. Additionally, the predetermined range should be set so that, the likelihood that the difference between the memristor cell voltage drop induced by the second read voltage and Vth exceeds the memristor cell switching voltage is sufficiently small so as to allow an error correcting code with reasonable redundancy to recover the original data, prior to accidental switches or read disturb. According to an example, the first read voltage and the second read voltage are within a close predetermined range of each other and each of the first read voltage and the second read voltage is sufficiently high to induce a voltage drop on the cell that exceeds the selector threshold voltage and is sufficiently low to not cause the cell to switch to a different state.

In block 530, the read/write control module 106, for instance, may identify a difference value between the first memristor cell current and the second memristor cell current. The difference value may also be amplified by the read/write control module 106, for instance.

In block 540, the read/write control module 106, for instance, may determine a resistance state of the memristor cell based on the difference value. For example, in response to detecting the amplified difference value being above a predetermined high threshold value, the read/write control module 106 may read a low resistance state for the memristor cell. Alternatively, in response to detecting the difference value being below a predetermined low threshold value, the read/write control module 106 may read a high resistance state for the memristor cell. The predetermined high threshold value is generally higher than the predetermined low threshold value. In addition, the predetermined high threshold value and the predetermined low threshold value may be set to any desired values and may be determined through testing. If the response is found to fall between the low and high threshold values, an error condition may be indicated to higher level control circuits and/or processors.

The method 500 may effectively measure the rate of change of the current, which may be a better indicator of the resistance state than measuring the current at a single static data point. Since both the reads may be performed at or below the normal read voltage of a memristor cell, which is below the write voltage for the memristor cell, it is unlikely that the method 500 causes any read disturbance.

Additionally, the method 500 may not only be effective in tolerating Vth variation in a selector. The method 500 may also tolerate high leakage or sneak current and the variation in leakage or sneak current. For example, assume that the sneak current of various memristor cells in the crossbar memory array are four times higher than the specified sneak current value (e.g., 750 nA vs. 190 nA). The increase in the sneak current may have a maximum impact on the memristor cell that is farthest from the voltage sources 111 and 112. In m×n memory array 101, with top left most cell representing the memristor cell (1,1), the memristor cell (m,n) located at the nth column and mth row is most impacted due to a large half-selected row and column. This impact may manifest itself in the form of a reduced voltage drop across the selected memristor cell. However, since method 500 measures the rate of change of the current instead of the actual value of the current, the loss in read voltage due to sneak current may be handled similarly to the loss in read voltage due to Vth variation in the selector.

Accordingly, the method 500 provides a low overhead, dual-sensing reading scheme that trades-off access time to dramatically improve the read margin to tolerate variations in selector threshold and leakage or sneak current. Generally speaking, the method 500 may improve the read margin for memristor cells in the crossbar memory array and enhances the distribution of ON and OFF current for the memristor cells in the crossbar memory array.

FIG. 6 shows a dual-sensing circuit 600 that may be used to implement the examples described herein. The dual-sensing circuit 600 may receive a first read voltage $V_{low}$ across a cell 602 from row driver 111 to sense a first cell current $I_{low}$ at column driver 112, which is sampled and held at a holding circuit 604. The dual-sensing circuit 600 may then receive a second read voltage $V_{high}$ across the cell 602 from row driver 111 to sense a second cell current $I_{high}$ at column driver 112. The difference value between the second cell current $I_{high}$ and the first cell current $I_{low}$ may be determined at a current differencing circuit 606. The difference value may then be compared to a predetermined threshold value $\Delta I_{ref}$ by a comparator circuit 608 to determine the resistance state for the cell 602. Other known electronic components may be added or substituted in the computer system 600.

What has been described and illustrated herein are examples of the disclosure along with some variations. The terms, descriptions and figures used herein are set forth by way of illustration only and are not meant as limitations. Many variations are possible within the scope of the disclosure, which is intended to be defined by the following claims—and their equivalents—in which all terms are meant in their broadest reasonable sense unless otherwise indicated.

What is claimed is:

1. A method for determining a resistance state of a cell in a crossbar memory array, said method comprising:
    applying, by a dual-sensing circuit, a first read voltage across a cell to sense a first cell current;
    applying a second read voltage across the cell to sense a second cell current;
    identifying and amplifying a difference value between the first cell current and the second cell current;
    reading a low resistance state for the cell in response to the amplified difference value being above a predetermined high threshold; and
    reading a high resistance state for the cell in response to the amplified difference value being below a predetermined low threshold.

2. The method of claim 1, wherein the first read voltage is lower than the second read voltage.

3. The method of claim 2, wherein the second read voltage is lower than a write voltage for the cell.

4. The method of claim 1, wherein the cell further includes a selector in series with the cell, the selector including a threshold voltage (Vth) to provide non-linearity to the cell.

5. The method of claim 4, wherein the first read voltage and the second read voltage are within a close predetermined range of each other, and wherein each of the first read voltage and the second read voltage is sufficiently high to induce a voltage drop on the cell that exceeds the selector threshold voltage and is sufficiently low to not cause the cell to switch to a different state.

6. The method of claim 1, wherein the cell is a memristor device that is to switch between an ON state with a low resistance and to an OFF state with a high resistance.

7. The method of claim 6, wherein the memristor device includes a matrix material containing mobile dopants that are to be moved within the matrix material to dynamically alter the electrical resistance of the memristor device, wherein locations and characteristics of the mobile dopants remain stable until an application of a programming electrical field.

8. A data storage system to determine a resistance state of a cell in a crossbar memory array, comprising:
    a processor;
    a memory storing machine readable instructions that are to cause the processor to:
    apply a first read voltage across a cell to measure a first cell current;
    apply a second read voltage across the cell to measure a second cell current, wherein the first read voltage is lower than the second read voltage;
    identify and amplify a difference value between the first cell current and the second cell current;
    read a low resistance state for the cell in response to the amplified difference value being above a predetermined high threshold value; and
    read a high resistance state for the cell in response to the amplified difference value being below a predetermined low threshold value.

9. The data storage system of claim 8, wherein the machine readable instructions are to cause the processor to provide non-linearity to the cell to reduce leakage or sneak current across a conductor of the crossbar memory array.

10. A system, comprising a dual-sensing circuit to:
    receive a first read voltage across a cell to measure a first cell current;
    receive a second read voltage across the cell to measure a second cell current, wherein the first read voltage is lower than the second read voltage and the second voltage is lower than a write voltage;
    determine a difference value between the first cell current and the second cell current;
    amplify the difference value;
    read a low resistance state for the cell in response to the amplified difference value exceeding a predetermined high threshold value; and read a high resistance state for the cell in response to the amplified difference value falling below a predetermined low threshold value.

11. The system of claim 10, wherein the cell further includes a selector in series with the cell, the selector including a threshold voltage (Vth) to provide non-linearity to the cell.

* * * * *